(12) United States Patent
Furuyama

(10) Patent No.: US 10,845,551 B2
(45) Date of Patent: Nov. 24, 2020

(54) OPTICAL TRANSMISSION DEVICE, METHOD FOR MANUFACTURING SAME, AND OPTICAL TRANSMISSION MODULE

(71) Applicant: KABUSHIKI KAISHA TOSHIBA, Tokyo (JP)

(72) Inventor: Hideto Furuyama, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/351,110

(22) Filed: Mar. 12, 2019

(65) Prior Publication Data

US 2020/0091679 A1 Mar. 19, 2020

(30) Foreign Application Priority Data

Sep. 18, 2018 (JP) ................. 2018-174033

(51) Int. Cl.
| | |
|---|---|
| G02B 6/42 | (2006.01) |
| G02B 6/43 | (2006.01) |
| H01S 5/42 | (2006.01) |
| H01S 5/042 | (2006.01) |
| H01S 5/022 | (2006.01) |
| H01L 23/12 | (2006.01) |
| G02B 6/36 | (2006.01) |
| H01L 23/00 | (2006.01) |

(52) U.S. Cl.
CPC ......... *G02B 6/4249* (2013.01); *G02B 6/3644* (2013.01); *G02B 6/4202* (2013.01); *G02B 6/423* (2013.01); *G02B 6/4274* (2013.01); *G02B 6/43* (2013.01); *H01S 5/02284* (2013.01); *H01S 5/04256* (2019.08); *H01S 5/423* (2013.01); *H01L 24/48* (2013.01); *H01S 5/02236* (2013.01); *H01S 5/02276* (2013.01)

(58) Field of Classification Search
None
See application file for complete search history.

(56) References Cited

U.S. PATENT DOCUMENTS

| | | | |
|---|---|---|---|
| 7,441,964 B2* | 10/2008 | Hamasaki ............ | G02B 6/4201 385/88 |
| 2005/0169596 A1* | 8/2005 | Hamasaki ............ | G02B 6/4249 385/137 |
| 2006/0039658 A1 | 2/2006 | Furuyama et al. | |

(Continued)

FOREIGN PATENT DOCUMENTS

| | | |
|---|---|---|
| JP | 2006-59867 A | 3/2006 |
| JP | 2015-22247 A | 2/2015 |
| JP | 2017-102208 A | 6/2017 |

*Primary Examiner* — Michelle R Connelly
(74) *Attorney, Agent, or Firm* — Finnegan, Henderson, Farabow, Garrett & Dunner, L.L.P.

(57) ABSTRACT

According to one embodiment, a via holds an optical fiber and has an opening in at least a first surface of a silicon substrate. An interconnect is provided at a second surface of the silicon substrate and connected to an optical semiconductor element. Side-surface electrodes are provided at a third surface of the silicon substrate. The third surface is other than the first surface and the second surface of the silicon substrate. At least a portion of the side-surface electrodes is connected to the interconnect. At least a portion of the side-surface electrodes have different lengths along the third surface.

15 Claims, 9 Drawing Sheets

(56) References Cited

U.S. PATENT DOCUMENTS

| | | | |
|---|---|---|---|
| 2006/0204182 A1* | 9/2006 | Murry | G02B 6/4202 385/88 |
| 2011/0249946 A1* | 10/2011 | Nakanishi | G02B 6/4202 385/88 |
| 2015/0030338 A1 | 1/2015 | Miyazaki et al. | |
| 2017/0153401 A1 | 6/2017 | Kurita et al. | |
| 2018/0069630 A1* | 3/2018 | Jiang | G02B 6/4274 |

* cited by examiner

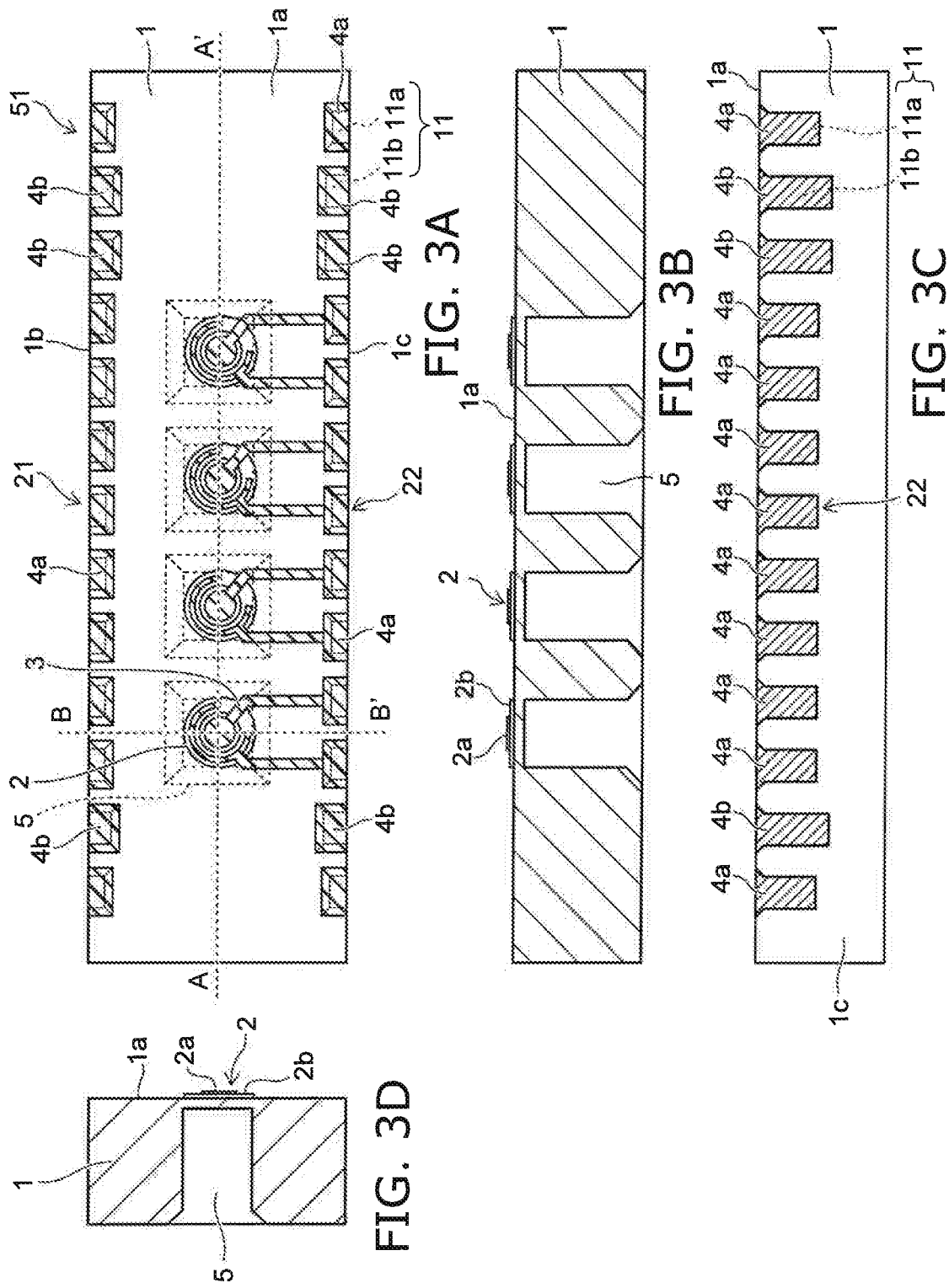

OPTICAL TRANSMISSION DEVICE, METHOD FOR MANUFACTURING SAME, AND OPTICAL TRANSMISSION MODULE

CROSS-REFERENCE TO RELATED APPLICATION

This application is based upon and claims the benefit of priority from Japanese Patent Application No. 2018-174033, filed on Sep. 18, 2018; the entire contents of which are incorporated herein by reference.

FIELD

Embodiments described herein relate generally to an optical transmission device, a method for manufacturing an optical transmission device, and an optical transmission module.

BACKGROUND

Optical transmission modules are used in high-speed local area networks, data center wiring, etc., and are being developed for higher speeds, downsizing, and higher density.

BRIEF DESCRIPTION OF THE DRAWINGS

FIGS. 3A to 3D are schematic configuration views of the optical transmission device of the first embodiment;

DETAILED DESCRIPTION

Figure 1:
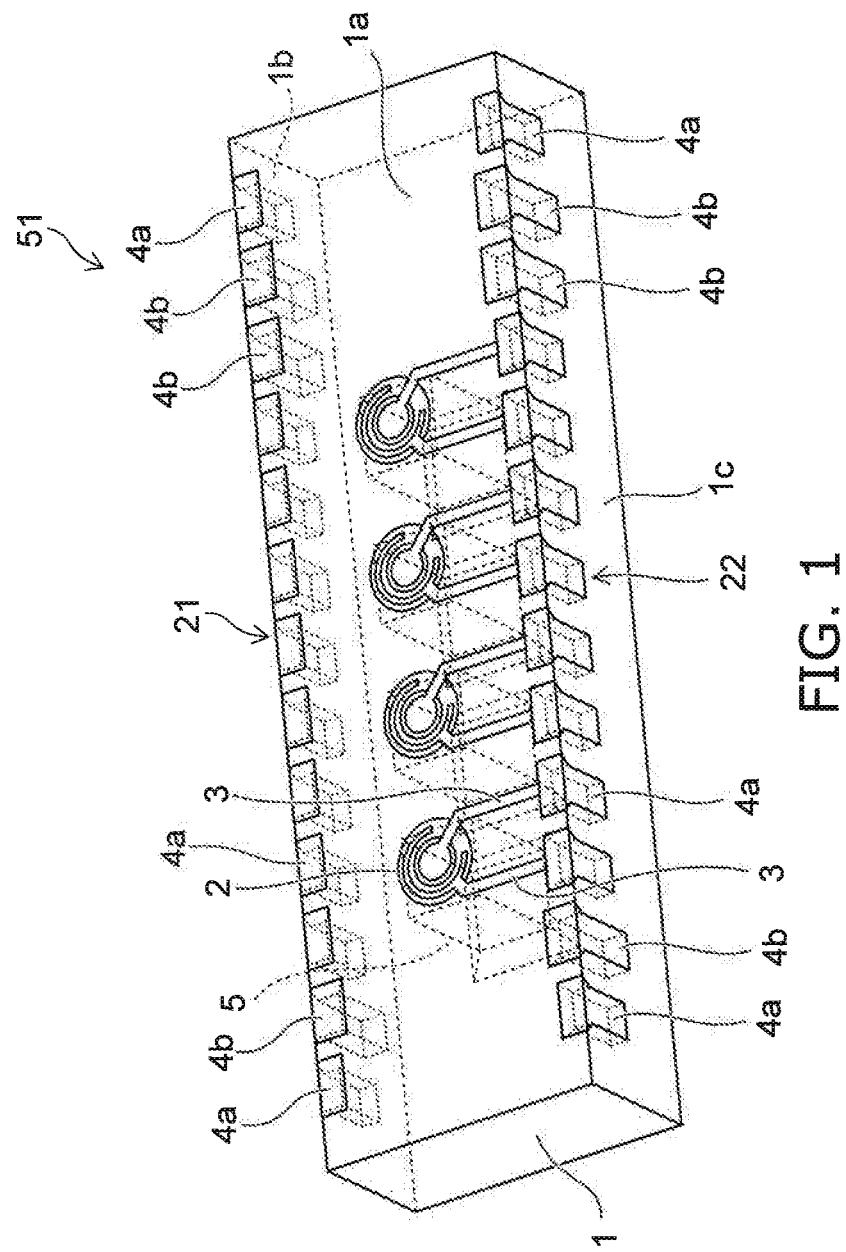
FIG. 1 is a schematic perspective view showing an optical transmission device of a first embodiment.

According to one embodiment, an optical transmission device includes a via, at least one optical semiconductor element, an interconnect, and a plurality of side-surface electrodes. The via holds an optical fiber and has an opening in at least a first surface of a silicon substrate. The optical semiconductor element is provided on a second surface of the silicon substrate opposing the first surface in a region where the via holding the optical fiber is formed. Or the optical semiconductor element is provided on the via holding the optical fiber on the second surface side of the silicon substrate opposing the first surface. The interconnect is provided at the second surface of the silicon substrate and connected to the optical semiconductor element. The side-surface electrodes are provided at a third surface of the silicon substrate. The third surface is other than the first surface and the second surface of the silicon substrate. At least a portion of the plurality of side-surface electrodes is connected to the interconnect. At least a portion of the plurality of side-surface electrodes have different lengths along the third surface.

Embodiments are described below with reference to the drawings as appropriate. For convenience of description, the scale in each drawing is not always accurate; and relative positional relationships, etc., may be used. The same or similar components are marked with the same reference numerals.

The downsizing of an optical transmission module has been problematic because a marker for recognizing the side-surface electrode (the perpendicular-surface electrode) arrangement of an optical transmission device of a direct-optical-fiber-connection optical element, a direct-optical-fiber-connection optical element mounting substrate, etc., has not been provided; and automatic recognition of the arrangement of the side-surface electrodes could not be performed.

Embodiments of the invention are directed to provide an optical transmission device, a method for manufacturing the optical transmission device, and a compact and inexpensive optical transmission module using the optical transmission device in which a marker for easily recognizing the arrangement of the side-surface electrodes is formed.

Optical transmission devices such as the direct-optical-fiber-connection optical element or the direct-optical-fiber-connection optical element mounting substrate of Patent Literature 1 to 3, etc., have been proposed to realize a broadband interconnect by configuring a high density optical transmission array by extremely downsizing an optical transmission module capable of high-speed transmission. In particular, by integrating optical elements in a Si substrate and by performing the positional alignment and the holding of the optical fibers using the Si substrate, Patent Literature 3 can realize an optical coupling module using the minimum configuration of only the optical elements (the integrated optical elements) and the optical fibers.

Generally, optical elements, and in particular, light-emitting elements include a compound semiconductor material (GaInAsP, AlGaAs, AlGaInAs, InGaN, etc.); and the crystal growth substrate of the element often includes a compound semiconductor (InP, GaAs, GaN, etc.) as well. Many compound semiconductors are cleavable due to crystal anisotropy and are difficult to use as a mechanical holder directly fixing the optical fiber due to damage occurring easily due to impact and stress.

However, in Patent Literature 3 recited above, a configuration is possible in which the optical elements are integrated in the Si substrate; and the optical fibers are pseudo-directly fixed to the optical elements by the Si substrate also holding the optical fiber. Because the substrate is Si, semiconductor manufacturing technology is applicable; and cost reduction by mass production is possible. By the application of semiconductor manufacturing technology, the high density array of the optical elements is formed easily; and a high density optical transmission module array can be configured by combining with a high density optical fiber array using a staggered arrangement of the optical fibers, etc. In other words, not only is a substantially optical fiber-attached optical element realizable, but also a large-capacity multi-core optical transmission module having higher density up to the physical limit of the arrangement of the optical fibers can be configured.

Such an optical transmission module is configured by electrically connecting a drive IC to the optical transmission device including optical elements or integrated optical elements; but if the drive IC is integrated in the Si substrate where the optical elements are integrated, the dedicated chip surface area increases for the drive IC; and it is often that the cost increases drastically due to yield decrease caused by processes other than the unique processes, prevention measures for contamination between composite materials, etc. Therefore, generally, the drive IC is manufactured as a separate chip; and the integration is performed using mounting technology.

Although a mounting configuration of the optical transmission module is possible in which the optical transmission device is stack-mounted with the drive IC, an external force is applied to the optical transmission device recited above via the optical fiber; therefore, a stack-mounted drive IC must mechanically receive the external force; and such a mounting configuration is not desirable due to degradation and/or damage of the drive IC.

Therefore, as shown in the embodiments described below, mounting configurations are widely used in which the drive IC and the optical transmission device or the optical coupling module are fixed in one mounting unit or module substrate so that stress is not transmitted; and the drive IC and the optical transmission device or the optical coupling module are electrically connected by, for example, a bonding wire, plated wiring, etc. In such a case, by configuring the optical fiber to be drawn out in a direction perpendicular to the mounting unit (or the module substrate) and by fixing the optical element integration surface of the optical transmission device and the circuit surface of the drive IC to face the same direction, the electrical connection is easy; but the component mounting height that generally needs to be thinner becomes extremely high because the optical fiber draw-out is in the direction perpendicular to the substrate when the optical transmission module is mounted to a printed circuit board, etc.

Therefore, as described below, side-surface electrodes are provided in the optical transmission device; the placing on the mounting unit or the module substrate is performed so that the integration surface of the optical element is perpendicular to the mounting surface; therefore, the optical fiber draw-out direction can be parallel to the mounting surface (providing a low component mounting height); and the electrical connection is easy because the optical transmission device and the electrical connection surface of the drive IC are in the same direction.

When integrating optical elements in a Si substrate by semiconductor manufacturing technology and then forming side-surface electrodes, generally, the side-surface electrodes are formed individually after singulating the optical transmission devices; or the side-surface electrodes are formed by forming the electrodes to be buried in the wafer state and by halving the electrodes when singulating; but the former is poor for mass production and prohibitively expensive; and for the latter, the shape discrimination of the side-surface electrodes is difficult; in particular, for higher pin-count side-surface electrodes, etc., problems occur due to misjudgment of the corresponding connections in the mounting process, that is, defective parts occur easily.

Therefore, a method for identifying the arrangement information of the side-surface electrodes may be considered in which the width and/or the pitch of the electrodes is intentionally changed when forming the side-surface electrodes in the optical transmission device; but in such a case, the arrangement pitch of the electrodes is not constant; therefore, the uniformity of the mounting interconnects (e.g., wire bonding) degrades; characteristic fluctuation, asymmetry, etc., of the wiring and/or the electrodes occurs easily; for example, jitter due to asymmetry of the wiring lengths of differential wiring, skew between optical transmission channels, etc., may occur. Accordingly, it is desirable to provide the side-surface electrodes of the optical transmission device with uniform widths and pitches; and a method for easily recognizing the arrangement information of such side-surface electrodes is desirable.

First Embodiment

FIG. 1 is a schematic perspective view showing an optical transmission device 51 of a first embodiment.

The optical transmission device 51 includes a silicon substrate 1, an optical element 2, a first electrode group 21, a second electrode group 22, and an interconnect 3. The silicon substrate 1 has an optical element surface 1a, a first side surface 1b, a second side surface 1c, and a via 5 provided in the surface opposing the optical element surface 1a. The optical element 2 is, for example, an optical semiconductor element such as a light-emitting device, a photodetector, etc.

At least one optical element 2 is provided in the optical element surface 1a. In the example shown in FIG. 1, multiple optical elements 2 are integrated in the optical element surface 1a of the silicon substrate 1. For example, the optical element surface 1a is formed in a rectangular configuration; and the multiple optical elements 2 are arranged along the longitudinal direction of the optical element surface 1a.

The via 5 has an opening at the surface of the silicon substrate 1 on the side opposite to the optical element surface 1a and is, for example, a blind via extending toward the optical element surface 1a from the opening. The optical element 2 is provided at a position opposing the bottom surface of the via (the blind via) 5. For example, the multiple vias 5 are arranged along the longitudinal direction of the optical element surface 1a to correspond to the multiple optical elements 2. As in Patent Literature 2, the via 5 may be a through-via; and the optical element 2 may be an optical element chip that is separately formed and placed so that the optical element is electrically connected to the interconnect 3 of the Si substrate 1.

The first side surface 1b and the second side surface 1c of the silicon substrate 1 cross the optical element surface 1a. For example, the first side surface 1b and the second side surface 1c are orthogonal to the optical element surface 1a. The second side surface 1c is provided on the side opposite to the first side surface 1b. For example, the first side surface 1b and the second side surface 1c also are formed in rectangular configurations.

The first electrode group 21 is provided in the first side surface 1b. The first electrode group 21 includes multiple side-surface electrodes 4a and 4b. The multiple side-surface electrodes 4a and 4b are separated from each other and are arranged along the longitudinal direction of the first side surface 1b at, for example, a uniform pitch. For example, the first electrode group 21 may be floating electrodes not electrically connected to the interconnects 3. Also, it is not always necessary to provide the first electrode group 21; and the first electrode group 21 may be omitted.

The second electrode group 22 is provided in the second side surface 1c. The second electrode group 22 also includes the multiple side-surface electrodes 4a and 4b. The multiple side-surface electrodes 4a and 4b are separated from each other and are arranged along the longitudinal direction of the second side surface 1c at, for example, a uniform pitch.

The interconnect 3 is provided at the optical element surface 1a. The interconnect 3 electrically connects the optical element 2 and the second electrode group 22.

Figure 2A:
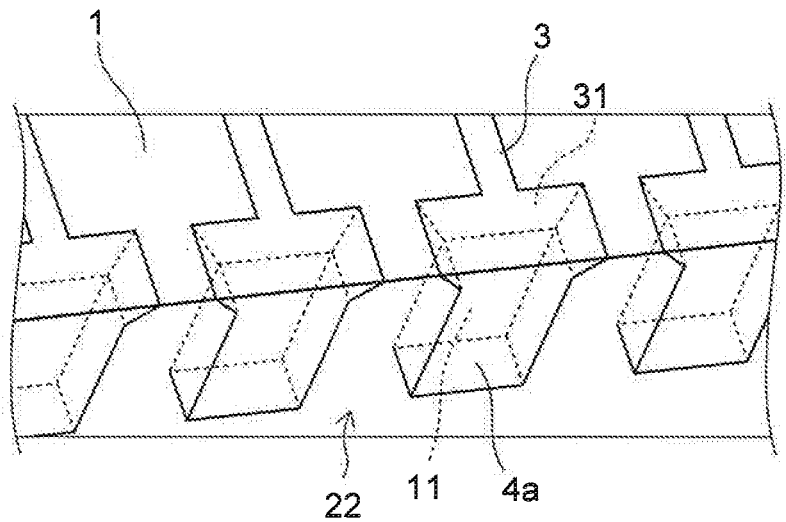
FIGS. 2A and 2B are detailed explanation views of side-surface electrodes of the optical transmission device of the first embodiment.

FIG. 2A is an enlarged perspective view of the second electrode group 22 connected to the interconnect 3.

Figure 2B:
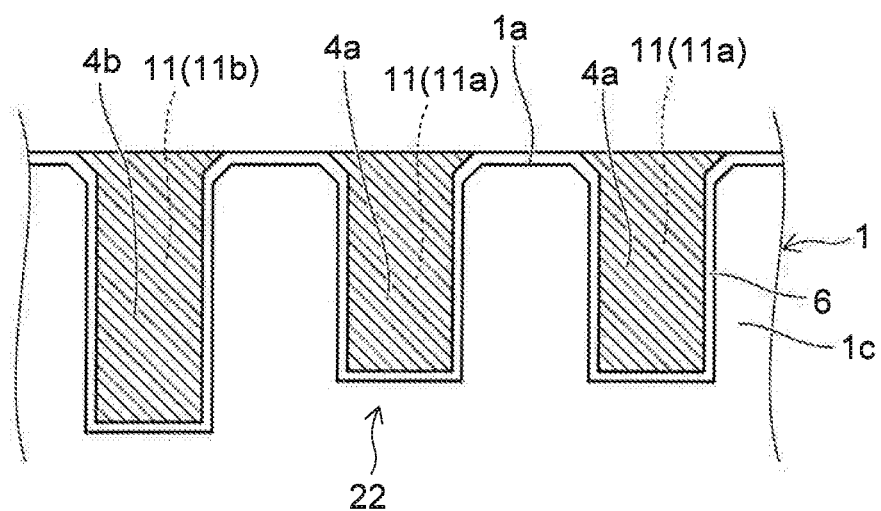

FIG. 2B is an enlarged cross-sectional view of the second electrode group 22.

The first electrode group 21 is configured similarly to the second electrode group 22.

The first electrode group 21 and the second electrode group 22 are formed by providing an insulating film 6 on the side surfaces and the bottom surfaces of the multiple vias (broken lines) 11 provided in the silicon substrate 1 and by filling the vias 11 with a metal such as Au, Ni, Cu, etc., by, for example, plating; and the side-surface electrodes 4a and 4b can be formed by cutting the metal in the via depth direction. As shown in FIG. 1, the side-surface electrodes 4a and 4b of the first electrode group 21 are exposed at the first side surface 1b; and the side-surface electrodes 4a and 4b of the second electrode group 22 are exposed at the second side surface 1c. The first electrode group 21 may not be formed by positioning the first electrode group 21 inside the dicing street (the cutting width) when cutting in the via depth direction described above. One end of each of the side-surface electrodes 4a and 4b is exposed at the optical element surface 1a.

The multiple vias 11 for forming the side-surface electrodes 4a and 4b are not so-called through-vias (TSVs (Through Silicon Vias)), but are non-through vias (blind vias) having openings at the optical element surface 1a. The vias 11 extend in the direction along the via 5 for holding the optical fiber from the surface opposite to that of the via 5. The multiple vias 11 include a first blind via 11a and a second blind via 11b having mutually-different depths.

The insulating film 6 insulates the side-surface electrodes 4a and 4b and the silicon substrate 1 and is, for example, a SiO$_2$ film. The insulating film 6 is formed also at the optical element surface 1a; and the interconnect 3 is formed on the insulating film 6. Hereinbelow, the insulating film 6 is not illustrated for simplicity of the drawings.

FIG. 3A is a top view of the optical transmission device 51 of the first embodiment.

FIG. 3B is an A-A' cross-sectional view of FIG. 3A.

FIG. 3C is a side view of the second side surface 1c of FIG. 3A.

FIG. 3D is a B-B' cross-sectional view of FIG. 3A.

As described below, the depths of the multiple vias 11 for forming the side-surface electrodes 4a and 4b are set to be different. Thereby, the length of the side-surface electrode 4a and the length of the side-surface electrode 4b are different from each other. Here, the lengths of the side-surface electrodes 4a and 4b are the lengths in the direction along the depth of the via 11. The length of the side-surface electrode 4a is shorter than the length of the side-surface electrode 4b. One end of the side-surface electrode 4a and one end of the side-surface electrode 4b are positioned at the optical element surface 1a. The other end of the side-surface electrode 4a and the other end of the side-surface electrode 4b are positioned at the bottom surfaces of the vias 11. The length from the one end to the other end of the side-surface electrode 4a is shorter than the length from the one end to the other end of the side-surface electrode 4b.

As shown in FIG. 1 and FIG. 3A, the width of the side-surface electrode 4a and the width of the side-surface electrode 4b are the same in the arrangement direction of the second electrode group 22 (or the first electrode group 21).

In a direction orthogonal to the arrangement direction of the second electrode group 22 (or the first electrode group 21), the width (the length) of the side-surface electrode 4b is larger (longer) than the width (the length) of the side-surface electrode 4a. The difference between the lengths of the side-surface electrode 4a and the side-surface electrode 4b is set to a length difference that can be distinguished by an image recognition device and/or microscopy and is set to be, for example, not less than 2 times the minimum resolution of the image recognition device, and favorably not less than 10 times the minimum resolution of the image recognition device.

For both the second electrode group 22 and the first electrode group 21 in the example shown in FIG. 1, the long side-surface electrode 4b is provided second from the left when viewed from the upper surface and second and third from the right when viewed from the upper surface. Several short side-surface electrodes 4a are connected to the optical elements 2 via the interconnects 3. The long side-surface electrode 4b is a marker particularly for identifying the arrangement of the second electrode group 22; and the arrangement information can be indicated by the positions and/or the continuous number of the side-surface electrodes 4b.

For example, in FIG. 3C, the long side-surface electrodes 4b are arranged laterally asymmetrically with respect to the arrangement-direction center of the electrode group; one long side-surface electrode 4b is disposed on the left side; and two long side-surface electrodes 4b are disposed on the right side. Thereby, it can be identified whether or not the placement position relationship of the optical transmission device 51 is correct; and the case where the orientation of the optical transmission device 51 is reversed in the plane or flipped can be discriminated easily because the lateral arrangement relationship of the side-surface electrodes 4b is reversed. Also, in the case where the optical transmission device 51 is flipped and the orientation is reversed, the formation positions of the side-surface electrodes 4b in the silicon substrate 1 are reversed vertically; therefore, the discrimination is possible using the number and the vertical positions of the long side-surface electrodes 4b.

Of course, the details of the side-surface electrodes 4a can be recognized from the relative relationship with respect to the side-surface electrodes 4b; for example, the optical element electrode positions can be recognized and wire connection can be performed automatically by pre-registering, in a wire bonder, etc., the information that eight electrodes of the optical elements 2 are arranged in the right direction from one side-surface electrode 4b.

Figure 4:
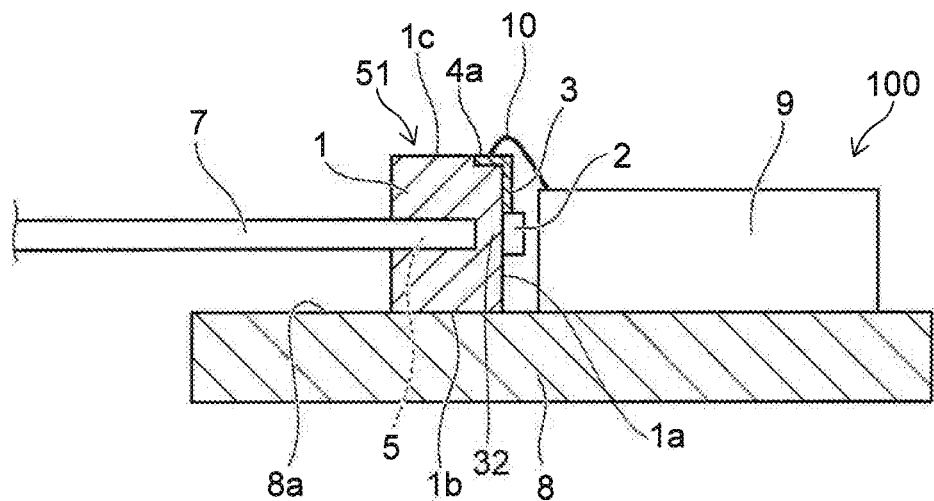
FIG. 4 is a schematic cross-sectional view of an optical transmission module of the first embodiment.

FIG. 4 is a schematic cross-sectional view of an optical transmission module 100 according to the first embodiment.

The optical transmission module 100 includes a module substrate 8, the optical transmission device 51 recited above mounted on the module substrate 8, and a semiconductor element 9 mounted on the module substrate 8. The semiconductor element 9 is, for example, a drive IC (Integrated Circuit) driving the optical element 2.

In the optical transmission module 100, the first side surface 1b where the first electrode group 21 is provided is mounted to oppose a mounting surface 8a of the module substrate 8. The second side surface 1c where the second electrode group 22 electrically connected to the optical elements 2 is provided faces upward from the mounting surface 8a of the module substrate 8. The side-surface electrodes 4a of the second electrode group 22 and the semiconductor element 9 are electrically connected by wires 10. Accordingly, the optical elements 2 are electrically connected to the semiconductor element 9 via the interconnects 3, the side-surface electrodes 4a, and the wires 10.

An optical fiber 7 is held in the via 5 of the silicon substrate 1. Light propagates between the optical fiber 7 and the optical element 2 via a thinned portion 32 of the silicon substrate 1 between the via 5 and the optical element surface 1a.

The configuration shown in FIG. 4 is effective in the case where the semiconductor element 9 and the optical transmission device 51 are fixed on the module substrate 8 and the wire connection between the semiconductor element 9 and the optical transmission device 51 is performed by an automatic wire bonder, etc. By using the optical transmission device 51 of the embodiment, mass production using automatic assembly apparatuses is possible; and an extremely inexpensive optical transmission module 100 can be configured because the arrangement information recognition error of the side-surface electrodes 4a and 4b is small and the manufacturing yield is high.

In the optical transmission module 100, the second side surface 1c where the second electrode group 22 of the optical transmission device 51 is provided may be mounted toward the mounting surface 8a of the module substrate 8; the semiconductor element 9 also may be mounted toward the mounting surface 8a of the module substrate 8; and the second electrode group 22 of the optical transmission device 51 and the electrodes of the semiconductor element 9 may be electrically connected by wiring provided in the mounting surface 8a of the module substrate 8. Also, a so-called fan-out wafer level package may be used in which the second side surface 1c where the second electrode group 22 of the optical transmission device 51 is provided and the surface where the electrodes of the semiconductor element 9 are formed are temporarily bonded to a dummy substrate; the optical transmission device 51 and the semiconductor element 9 are molded by a resin; the dummy substrate is peeled off; and rerouting of the optical transmission device 51 and the semiconductor element 9 is formed by plating, etc.

Also, in such an optical transmission module, the error of the arrangement information recognition can be smaller by using the side-surface electrodes 4a and 4b for positional alignment when placing the optical transmission device 51 on the wiring of the module substrate 8 and for pattern alignment when providing the rerouting on the optical transmission device 51; therefore, the manufacturing yield also is high; and an extremely inexpensive optical transmission module 100 can be configured.

Thus, according to the embodiment, it is possible to recognize the electrode arrangement information, etc., by observing only the side-surface electrodes 4a and 4b; and a high pin-count connection of the side-surface electrodes 4a and 4b can be performed reliably without modifying the width (the width in the arrangement direction) and/or the pitch of the side-surface electrodes 4a and 4b. Also, optical transmission module manufacturing is possible using automatic apparatuses; and the supply of an inexpensive high density multi-core optical transmission module is possible.

Second Embodiment

FIG. 5 to FIG. 8 are schematic top views showing a method for manufacturing the optical transmission device 51 of the first embodiment.

Figure 5:
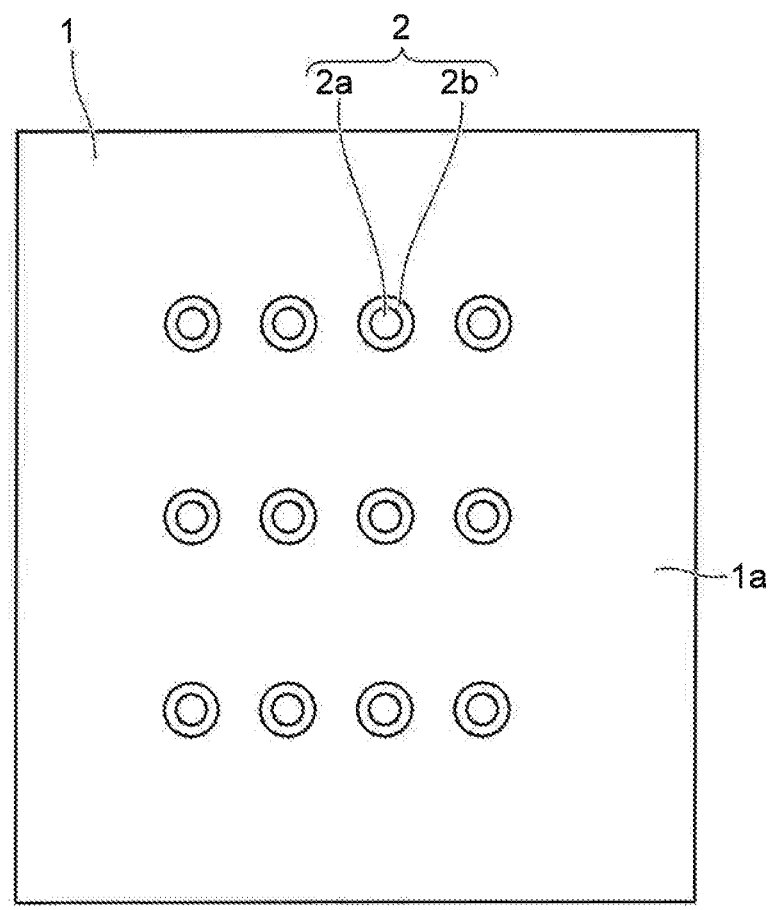
FIG. 5 to FIG. 8 are schematic top views showing a method for manufacturing the optical transmission device of the first embodiment.

FIG. 5 shows the state in which the multiple optical elements 2 are formed in the first major surface (the optical element surface) is of the silicon substrate 1.

The optical element 2 is, for example, a surface-emitting semiconductor laser and includes a p-type region 2a and an n-type region 2b. For example, the surface-emitting semiconductor laser is formed by crystal growth of a compound semiconductor multilayer film including a p-type semiconductor multilayer mirror, a light-emitting layer, and an n-type semiconductor multilayer mirror on a compound semiconductor substrate, directly bonding the compound semiconductor multilayer film on the cleaned first major surface (the optical element surface) 1a of the silicon substrate 1, performing heat treatment, and removing the compound semiconductor substrate and the unnecessary regions of the compound semiconductor multilayer film by etching. A p-type ohmic electrode and an n-type ohmic electrode also are formed in the surface-emitting semiconductor laser.

Figure 6:
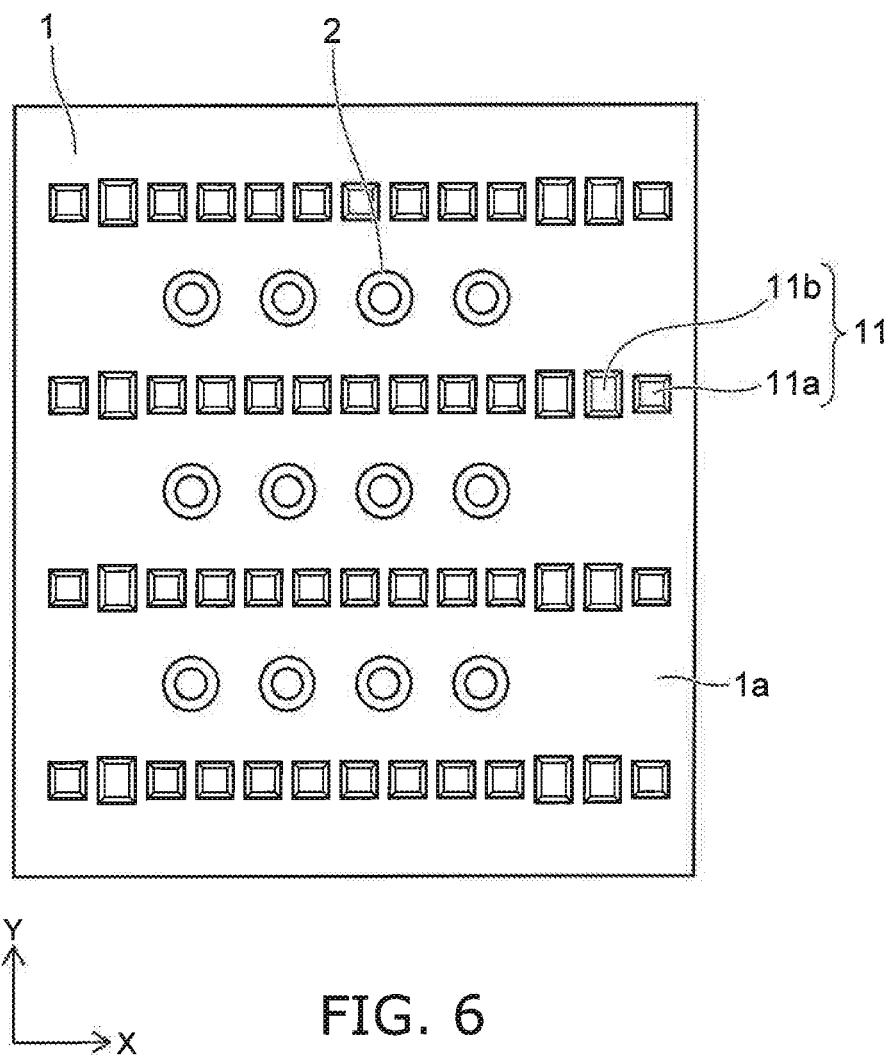

FIG. 6 shows the state in which the multiple blind vias 11 are formed in the silicon substrate 1.

The blind vias 11 have openings at the first major surface (the optical element surface) 1a. The multiple blind vias 11 are arranged along an X-direction. The multiple blind vias 11 that are arranged along the X-direction form one via column. Multiple via columns are arranged also in a Y-direction orthogonal to the X-direction. The multiple optical elements 2 are arranged along the X-direction in the region between the via column and the via column.

The multiple blind vias 11 include the first blind via 11a and the second blind via 11b. The second blind via 11b is deeper than the first blind via 11a.

The arrangement pitch in the X-direction of the multiple blind vias 11a and 11b is constant; and the opening width in the X-direction of the first blind via 11a and the opening width in the X-direction of the second blind via 11b are the same. For example, the blind vias 11a and 11b that have opening widths in the X-direction of 80 μm are formed at a pitch along the X-direction of 125 μm.

However, unlike the opening width in the X-direction of the first blind via 11a and the opening width in the X-direction of the second blind via 11b, the opening width in the Y-direction of the second blind via 11b is wider than the opening width in the Y-direction of the first blind via 11a. For example, the opening width in the Y-direction of the first blind via 11a is 80 μm; and the opening width in the Y-direction of the second blind via 11b is 150 μm.

The multiple blind vias 11 that include the first blind via 11a and the second blind via 11b are formed simultaneously by dry etching. For example, the multiple blind vias 11 are formed by a so-called Bosch process. The Bosch process is dry etching in which the three steps of isotropic etching of silicon, depositing a protective film, and anisotropic etching of the silicon (removing the protective film at the bottom surface of openings) are repeated; and the Bosch process realizes a via perpendicular to the silicon substrate at a high speed and a high aspect ratio. For example, $SF_6$ gas is used to etch the silicon; and, for example, $C_4F_8$ gas is used to deposit the protective film.

As recited above, for example, a photoresist mask is formed to have a first opening of 80 μm×80 μm at the position where the first blind via 11a is to be formed, and a second opening of 80 μm×150 μm at the position where the second blind via 11b is to be formed; and the first blind via 11a is etched by the Bosch process recited above to a depth of, for example, 80 μm. At this time, the opening surface area of the second blind via 11b is larger than that of the first blind via 11a; therefore, the etching of the second blind via 11b progresses more easily than for the first blind via 11a; and the second blind via 11b is etched to a depth of about 90 to 100 μm.

By performing isotropic etching to a depth of, for example, 20 μm before the Bosch process recited above and then continuing etching with the Bosch process to a total depth of 80 µm (the depth of the first blind via 11a), an opening spreading portion 31 that has a tapered configuration can be formed in the opening edge of the blind via 11 as shown in FIG. 2A. The tapered opening spreading portion 31 can prevent electrical disconnects at the connection portion between the interconnect 3 formed in the first major surface (the optical element surface) 1a of the silicon substrate 1 and a buried electrode 4 inside the blind via 11 when forming the interconnect 3 shown in FIG. 7. Subsequently, the photoresist is removed; and the formation of the blind via 11 is complete.

Figure 7:
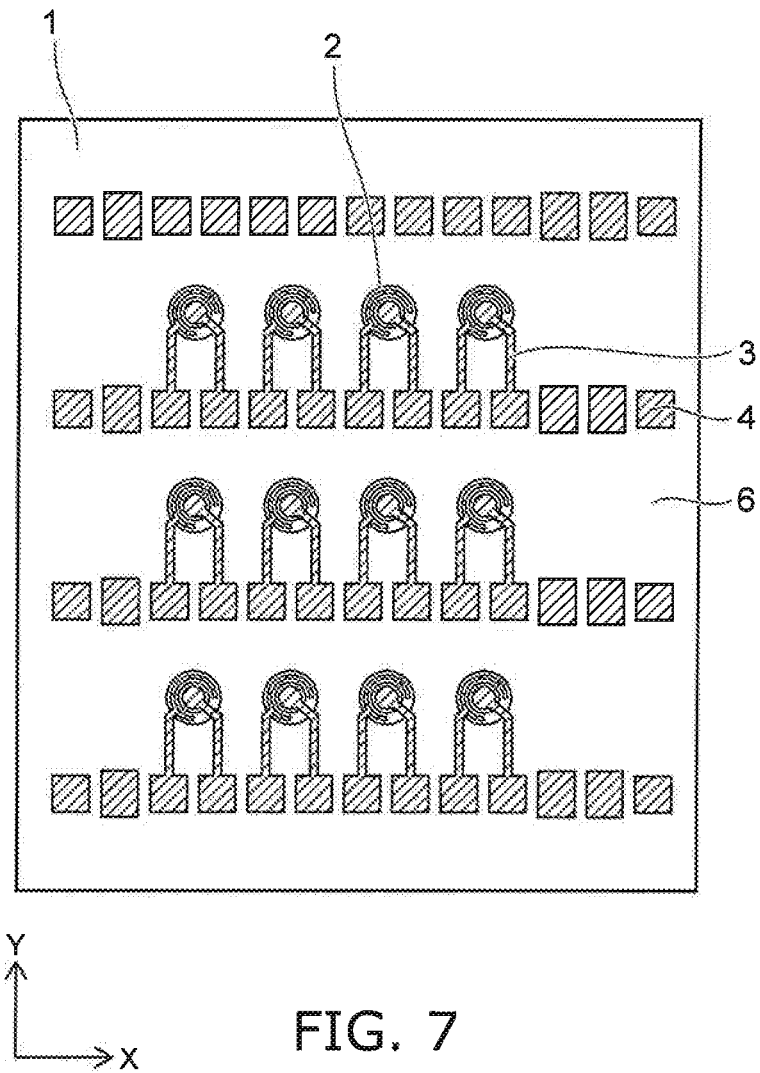

In this state, the insulating film 6 described above (e.g., the SiO$_2$ film) is formed on the entire surface of the exposed surface of the silicon substrate 1 to have a flat-portion thickness of, for example, 400 nm; further, for example, a seed layer is formed by forming 30 nm of Ti, 10 nm of Pt, and 20 nm of Au on the entire surface. Subsequently, a photoresist is formed in the regions other than the blind vias 11; and, for example, the blind vias 11 are filled with Au by performing Au plating. Thereby, as shown in FIG. 7, the electrodes 4 are formed inside the blind vias 11. Thereafter, the photoresist is removed; and polishing of the Au plating protrusions is performed if the unevenness of the Au plating is severe. Then, the seed layer that is exposed by the removal of the photoresist is removed by etching.

Then, contact holes are formed in the insulating film 6 on the p-type ohmic electrodes and the n-type ohmic electrodes of the optical elements 2; for example, 30 nm of Ti, 10 nm of Pt, and 300 nm of Au are formed on the entire surface; and a photoresist pattern is formed and etching is performed so that the optical element interconnects 3 and the electrodes 4 filled into the blind vias 11 remain. Thereby, the p-type ohmic electrodes and the n-type ohmic electrodes of the optical elements 2 are electrically, connected respectively to the electrodes 4 inside the blind vias 11.

Figure 8:
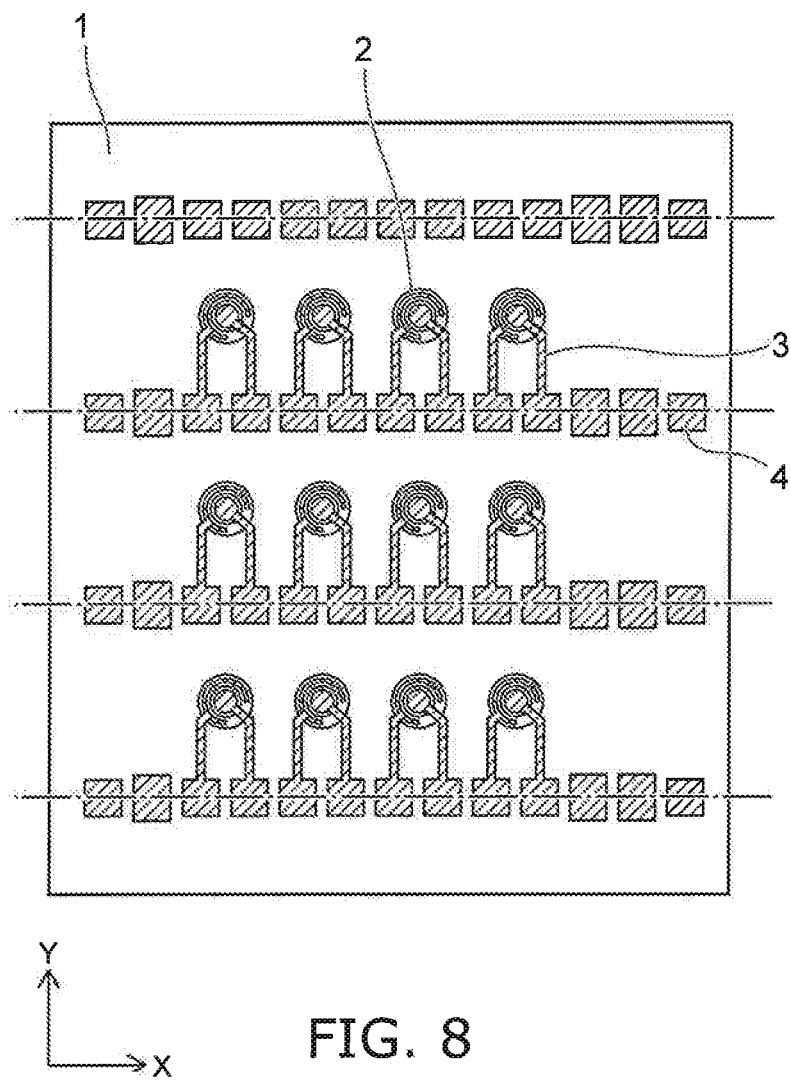

Then, the silicon substrate 1 is cut at the position of the single dot-dash line of FIG. 8 extending to cross, in the X-direction, the column of the electrodes 4 inside the blind vias 11 arranged in the X-direction; and the multiple optical transmission devices are singulated. For example, the singulation is performed using blade dicing. The electrodes 4 inside the blind vias 11 are subdivided into two in the Y-direction. Also, the first side surface 1b and the second side surface 1c of the silicon substrate 1 described above are formed by the dicing.

By subdividing the electrodes 4 inside the blind vias 11 into two in the Y-direction, two cross sections are made from one electrode 4. One cross section is exposed at the first side surface 1b; and the electrodes at the one cross section are included in the first electrode group 21. The other cross section is exposed at the second side surface 1c; and the electrodes at the other cross section are included in the second electrode group 22. At this time, as described above, the first electrode group 21 can be caused to disappear by adjusting the cutting position and the cutting width of the dicing, etc.

The side-surface electrodes 4a are obtained by subdividing the electrodes 4 provided inside the first blind vias 11a; and the long side-surface electrodes 4b that are longer (longer in the direction along the depth of the blind vias 11) than the side-surface electrodes 4a are obtained by subdividing the electrodes 4 provided inside the second blind vias 11b that are deeper than the first blind vias 11a.

According to the embodiment, multiple types of the blind vias 11a and 11b having different depths can be formed in one process; and by forming the electrodes inside the blind vias 11a and 11b, the side-surface electrodes 4a and 4b can be formed simultaneously to have the multiple types of lengths recited above even though the pitch in the arrangement direction and the width in the arrangement direction are constant. Accordingly, mass production using semiconductor manufacturing technology is possible; the side-surface electrodes 4a and 4b that have the multiple types of lengths can be formed in one electrode process; therefore, the arrangement information marker of the side-surface electrodes 4a and 4b can be formed without a special cost increase.

Third Embodiment

Figure 9:
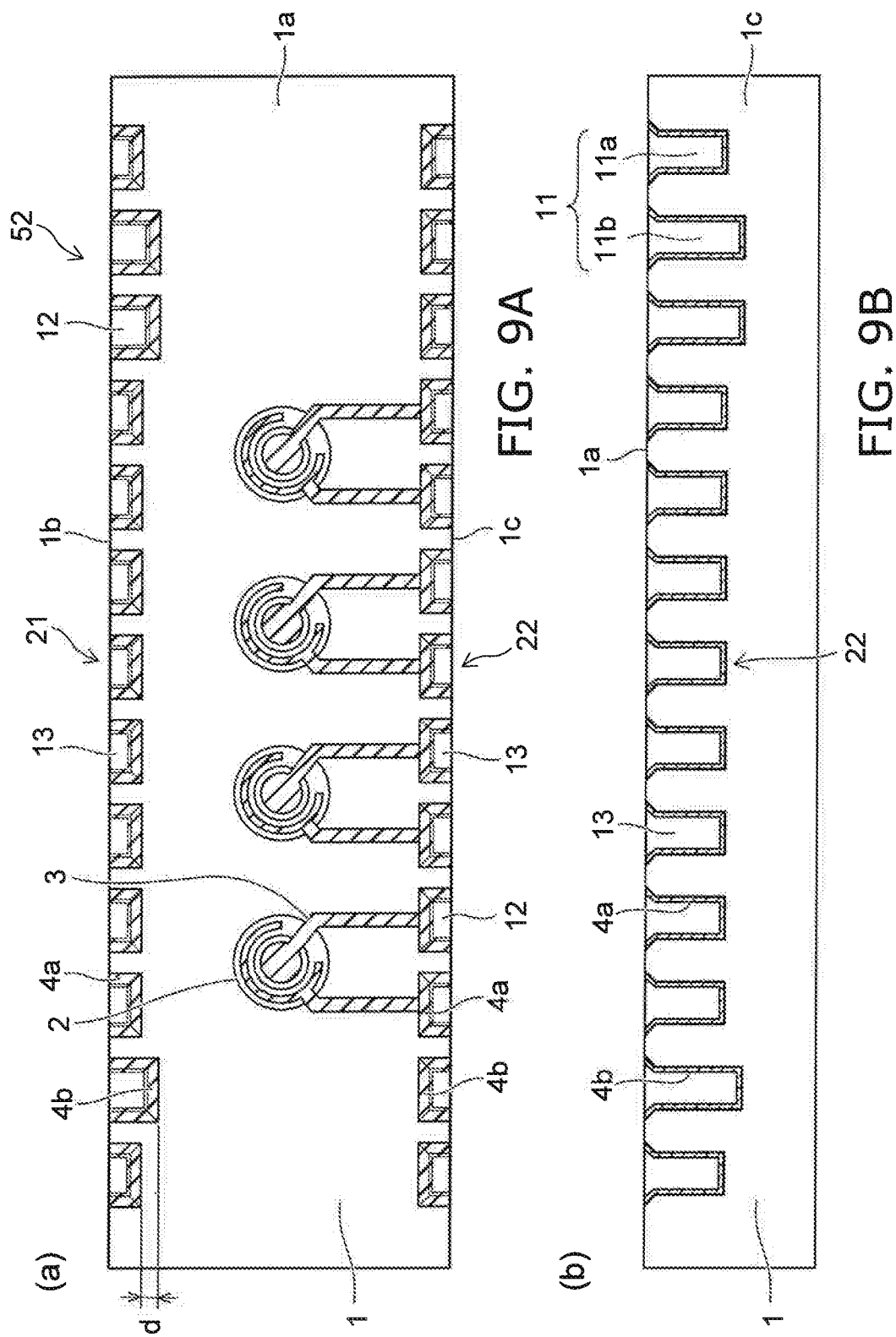
FIGS. 9A and 9B are schematic configuration views of an optical transmission device of a second embodiment.

FIG. 9A is a top view of an optical transmission device 52 of a third embodiment.

FIG. 9B is a side view of the second side surface 1c of the optical transmission device 52.

Figure 10:
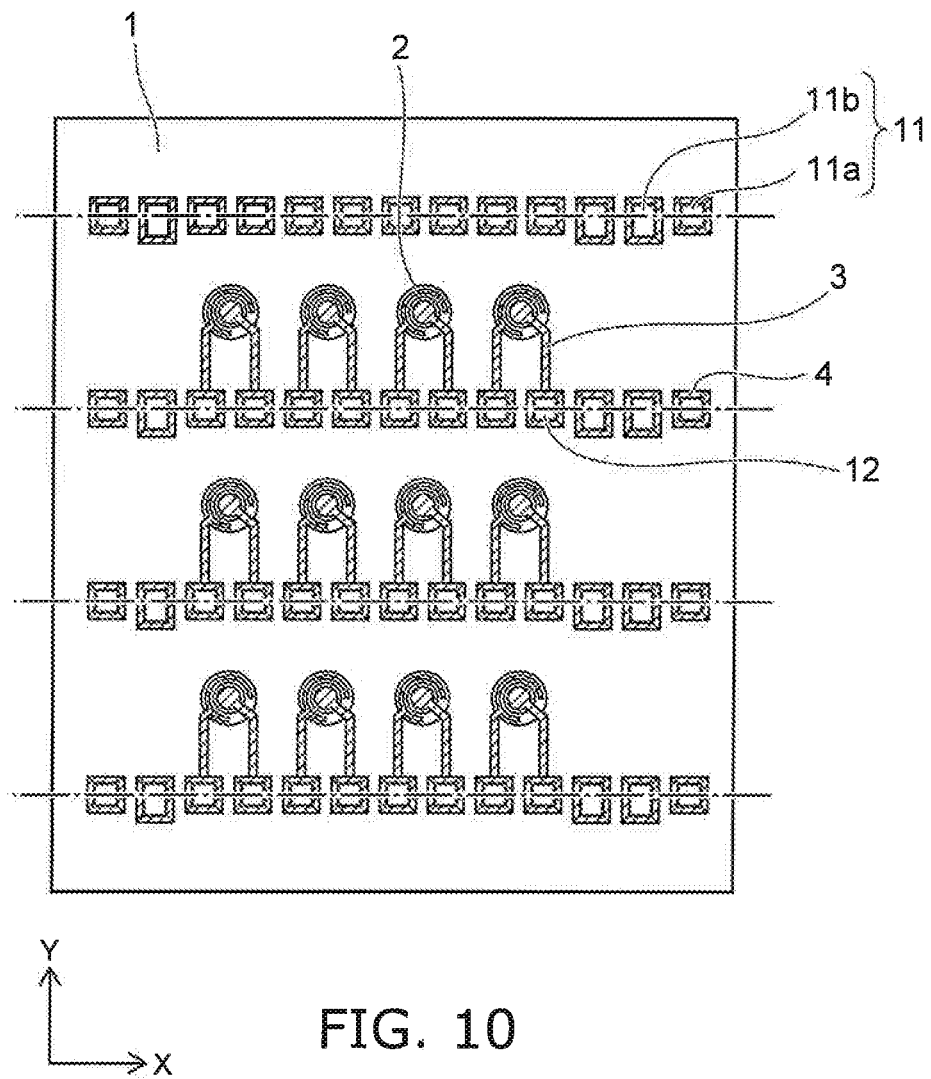
FIG. 10 is a schematic top view showing a method for manufacturing the optical transmission device of the second embodiment.

FIG. 10 is a top view showing a method for manufacturing the optical transmission device 52.

FIG. 9A corresponds to the top view of FIG. 3A of the first embodiment; FIG. 9B corresponds to the side view of FIG. 3C of the first embodiment; and FIG. 10 corresponds to the top view of FIG. 8 of the first embodiment. The corresponding components of the first embodiment and the third embodiment are marked with the same reference numerals.

In the embodiment, the electrode material for forming the side-surface electrodes 4a and 4b does not completely fill the interiors of the blind vias 11; and electrode unfilled portions (cavity portions) 12 are formed inside the blind vias 11.

Recesses 13 that are concave from the first side surface 1b and the second side surface 1c are formed by cutting the blind vias 11 including the cavity portions 12 at the single dot-dash line position shown in FIG. 10. The recesses 13 have openings at the first side surface 1b and the second side surface 1c.

One end of the recess 13 is an open end that is open at the optical element surface 1a; and the other end of the recess 13 is a plugged end positioned inside the silicon substrate 1. The side-surface electrodes 4a and 4b are provided at the bottom surfaces and the side surfaces (including the end surfaces of the plugged ends) of the recesses 13.

The depth of the recess 13 is the distance between the opening and the bottom surface; and the depth direction of the recess 13 (in FIG. 9A, the vertical direction) is orthogonal to the depth direction of the blind via 11 (in FIG. 9B, the vertical direction). In FIG. 9B, the depth direction of the recess 13 is a direction orthogonal to the page surface.

As shown in FIG. 9A, the multiple recesses 13 that are formed in the first side surface 1b have recesses having different depths. On the other hand, the depth is the same for all of the recesses 13 formed in the second side surface 1c. However, as shown in FIG. 9B, the multiple recesses 13 that are formed in the second side surface 1c have recesses having different lengths. The lengths of the recesses 13 correspond to the depths of the blind vias 11. The multiple recesses 13 that are formed in the first side surface 1b also include recesses having different lengths. The side-surface electrodes 4b are provided in the recesses 13 that are longer than the recesses 13 in which the side-surface electrodes 4a are provided.

In the first embodiment shown in FIG. 3A, the side-surface electrodes 4a and 4b have substantially the same outer surface as the side surfaces 1b and 1c of the silicon substrate 1; but in the third embodiment, the side-surface electrodes 4a and 4b are concave from the side surfaces 1b and 1c of the silicon substrate 1. The metal filling of the blind vias 11 requires an extremely thick plating process; therefore, the cost of the plating process easily becomes a large burden; and problems occur easily such as incomplete filling due to fluctuation of the plating filling and yield decrease due to abnormal plating. The third embodiment can avoid such problems. Namely, a plating thickness of about 100 μm is necessary for the plating filling of the blind vias 11 described in the second embodiment; and the difference between the plating filling configurations occurring easily due to the different depths of the first blind via 11a and the second blind via 11b, etc., can be eliminated.

In the formation of the side-surface electrodes 4a and 4b shown in FIGS. 9A and 9B, for example, the Au plating on the seed layer described above is formed to be drastically thin, e.g., about 2 μm. When the side-surface electrodes 4a and 4b are formed by cutting, the Au thickness of the side-surface electrodes 4a and 4b is 2 μm or more and is a sufficient thickness as the electrode metal.

However, in the case where the side-surface electrodes 4a and 4b are connected to the semiconductor element (the drive IC) 9, a power supply, a ground potential, etc., by an electrical connection such as wire bonding, etc., for the blind vias 11 shown in FIG. 3A, the bottom surfaces of the side-surface electrodes 4a and the bottom surfaces of the side-surface electrodes 4b may not be uniform; and the wire bonding may be difficult.

Therefore, even in the case where the depths of the blind vias 11a and 11b are different, in the third embodiment, the bottom surface heights of the multiple recesses 13 obtained by cutting the multiple blind vias 11a and 11b as shown in FIG. 9A are caused to match so that the bottom surface heights of the side-surface electrodes 4a and 4b are uniform. In the example shown in FIG. 9A, the bottom surface heights of the multiple recesses 13 formed in the second side surface is that are wire-bonded match.

However, because the side-surface electrodes 4a and 4b function as markers for identifying the arrangement of the second electrode group 22 as shown in FIG. 9B, it is necessary for the depth of the first blind via 11a and the depth of the second blind via 11b to be different. In other words, it is necessary for the opening width of the first blind via 11a in the direction orthogonal to the arrangement direction to be different from the opening width of the second blind via 11b in the direction orthogonal to the arrangement direction.

Therefore, an offset d such as that shown in FIG. 9A is provided at the edge positions of the openings of the blind vias 11a and 11b which are the recesses 13 having the openings at the first side surface 1b that are not wire-bonded. For example, as described above, in the case where the opening size of the first blind via 11a is 80 μm×80 μm and the opening size of the second blind via 11b is 80 μm×150 μm, the offset d shown in FIG. 9A can be set to 70 μm.

FIG. 10 corresponds to the process of FIG. 8 of the first embodiment. As shown in FIG. 10, one end in the Y-direction of the opening of the first blind via 11a and one end in the Y-direction of the opening of the second blind via 11b are aligned along the X-direction. On the other hand, the position of the other end in the Y-direction of the opening of the first blind via 11a is shifted in the Y-direction with respect to the position of the other end in the Y-direction of the opening of the second blind via 11b. Thus, the opening width in the Y-direction of the second blind via 11b is set to be wider than the opening width in the Y-direction of the first blind via 11a. Accordingly, the second blind via 11b can be set to be deeper than the first blind via 11a by simultaneously performing dry etching of the first blind via 11a and the second blind via 11b in a Bosch process.

By cutting at the position of the single dot-dash line shown in FIG. 10, the depths of the multiple recesses 13 of the side-surface electrodes 4a and 4b, which are connected to the optical elements 2 via the interconnects 3 and are the object of the wire bonding, can be uniform within, for example, about 5 μm. Accordingly, the side-surface electrodes 4a and 4b are applicable as electrical connection pads of wire bonding, etc., without problems.

Also, pattern recognition of the side-surface electrodes 4a and 4b is possible using the difference of the lengths of the recesses 13 (the depths of the blind vias 11) shown in FIG. 9B that appear at the cross sections.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. An optical transmission device, comprising:
a via holding an optical fiber and having an opening in at least a first surface of a silicon substrate;
at least one optical semiconductor element, the optical semiconductor element being provided on a second surface of the silicon substrate opposing the first surface in a region where the via holding the optical fiber is formed, or the optical semiconductor element being provided on the via holding the optical fiber on the second surface side of the silicon substrate opposing the first surface;
an interconnect provided at the second surface of the silicon substrate and connected to the optical semiconductor element; and
a plurality of side-surface electrodes provided at a third surface of the silicon substrate, the third surface being other than the first surface and the second surface of the silicon substrate the plurality of side-surface electrodes including a first side-surface electrode connected to the optical semiconductor element through the interconnect and a second side-surface electrode not connected to the optical semiconductor element,
a length of the first side-surface electrode along the third surface being different from a length of the second side-surface electrode along the third surface.

2. The device according to claim 1, wherein
the plurality of side-surface electrodes includes three or more side-surface electrodes, and
the three or more side-surface electrodes are arranged at a uniform pitch along the third surface.

3. The device according to claim 1, wherein
the plurality of side-surface electrodes include a plurality of first side-surface electrodes connected to a plurality of optical semiconductor elements through a plurality of interconnects, and
heights to the third surface are substantially uniform for the plurality of first side-surface electrodes connected to the interconnects among the plurality of optical semiconductor elements.

4. An optical transmission module, comprising:

a module base body;

a semiconductor element;

the optical transmission device according to claim 1 mounted on the module base body to cause a surface of the optical transmission device where the side-surface electrodes is provided and an electrode surface of the semiconductor element to face the same direction;

an inter-chip interconnect electrically connecting at least a portion of electrodes of the semiconductor element and at least a portion of the side-surface electrodes of the optical transmission device; and an optical fiber held in the via of the silicon substrate of the optical transmission device.

5. The device according to claim 1, wherein a plurality of optical semiconductor elements are provided on the second surface of the silicon substrate, and the plurality of optical semiconductor elements are separated from each other on the second surface of the silicon substrate.

6. The device according to claim 5, wherein the second side-surface electrode is not provided between the plurality of optical semiconductor elements.

7. An optical transmission device, comprising:

a silicon substrate having an optical element surface, a side surface, and a via extending toward the optical element surface from a surface on a side opposite to the optical element surface;

an optical element provided at the optical element surface;

a plurality of side-surface electrodes provided at the side surface, the side-surface electrodes including a first side-surface electrode and a second side-surface electrode, a length in a direction along the side surface of the first side-surface electrode being different from a length in the direction along the side surface of the second side-surface electrode; and an interconnect provided at the optical element surface, the interconnect electrically connecting the optical element and the first side-surface electrode, the interconnect not connecting the optical element and the second side-surface electrode.

8. The device according to claim 7, wherein the side-surface electrodes are provided at bottom surfaces and side surfaces of a plurality of recesses, the recesses being formed from the side surface to be concave to the same depth, and a length in the direction along the side surface of the recess with the first side-surface electrode being provided is different from a length in the direction along the side surface of the recess with the second side-surface electrode being provided.

9. The device according to claim 7, wherein a width of the first side-surface electrode and a width of the second side-surface electrode are the same in an arrangement direction of the side-surface electrodes, and an electrode spacing is the same for the side-surface electrodes in the arrangement direction.

10. An optical transmission module, comprising:

a module base body;

a semiconductor element;

the optical transmission device according to claim 7 mounted on the module base body to cause a surface of the optical transmission device where the side-surface electrodes is provided and an electrode surface of the semiconductor element to face the same direction;

an inter-chip interconnect electrically connecting at least a portion of electrodes of the semiconductor element and at least a portion of the side-surface electrodes of the optical transmission device; and an optical fiber held in the via of the silicon substrate of the optical transmission device.

11. The device according to claim 7, wherein a plurality of optical elements are provided on the optical element surface of the silicon substrate, and the plurality of optical elements are separated from each other on the optical element surface of the silicon substrate.

12. The device according to claim 11, wherein the second side-surface electrode is not provided between the plurality of optical elements.

13. A method for manufacturing an optical transmission device, comprising:

forming an optical element at a first major surface of a silicon substrate;

forming a plurality of blind vias arranged along a first direction in the silicon substrate, the blind vias having openings at the first major surface and including a first blind via and a second blind via, a depth of the second blind via being different from a depth of the first blind via;

forming an electrode inside the blind vias;

forming an interconnect at the first major surface, the interconnect connecting the electrode and the optical element; and dividing the electrode inside the blind vias in a second direction orthogonal to the first direction by cutting the silicon substrate along the first direction at a position where the blind vias are arranged.

14. The method according to claim 13, wherein an opening width in the second direction of the first blind via is different from an opening width in the second direction of the second blind via, and the blind vias including the first blind via and the second blind via are formed simultaneously by dry etching.

15. The method according to claim 14, wherein one end in the second direction of an opening of the first blind via and one end in the second direction of an opening of the second blind via are aligned along the first direction, and a position of another end in the second direction of the opening of the first blind via is shifted in the second direction with respect to a position of another end in the second direction of the opening of the second blind via.

* * * * *